(12) United States Patent
Nguyen et al.

(10) Patent No.: US 8,299,365 B2
(45) Date of Patent: Oct. 30, 2012

(54) SELF-ALIGNED COMPOSITE M-MOX/DIELECTRIC CAP FOR CU INTERCONNECT STRUCTURES

(75) Inventors: Son Van Nguyen, Yorktown Heights, NY (US); Alfred Grill, Yorktown Heights, NY (US); Thomas J. Haigh, Jr., Albany, NY (US); Hosadurga Shobha, Albany, NY (US); Tuan A. Vo, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 278 days.

(21) Appl. No.: 12/683,590

(22) Filed: Jan. 7, 2010

(65) Prior Publication Data

US 2011/0162874 A1    Jul. 7, 2011

(51) Int. Cl.
*H05K 1/09* (2006.01)
(52) U.S. Cl. ......... 174/257; 174/256; 257/774; 361/763
(58) Field of Classification Search .................. 174/257, 174/256; 427/97.2; 257/774; 361/763
See application file for complete search history.

(56) References Cited

U.S. PATENT DOCUMENTS

| 6,365,506 | B1 * | 4/2002 | Chang et al. ................. 438/624 |
| 7,052,932 | B2 | 5/2006 | Huang et al. |
| 7,378,343 | B2 * | 5/2008 | Chen et al. ................. 438/638 |
| 7,491,658 | B2 | 2/2009 | Nguyen et al. |
| 2009/0278258 | A1 | 11/2009 | Yang et al. |

OTHER PUBLICATIONS

International Search Report/Written Opiinion, Aug. 30, 2011.

* cited by examiner

*Primary Examiner* — Yuriy Semenenko
*Assistant Examiner* — Andargie M Aychillhum
(74) *Attorney, Agent, or Firm* — Scully, Scott, Murphy & Presser, P.C.; H. Daniel Schnurmann

(57) ABSTRACT

An interconnect structure is provided that has improved electromigration resistance as well as methods of forming such an interconnect structure. The interconnect structure includes an interconnect dielectric material having a dielectric constant of about 4.0 or less. The interconnect dielectric material has at least one opening therein that is filled with a Cu-containing material. The Cu-containing material within the at least one opening has an exposed upper surface that is co-planar with an upper surface of the interconnect dielectric material. The interconnect structure further includes a composite M-MOx cap located at least on the upper surface of the Cu-containing material within the at least one opening. The composite M-MOx cap includes an upper region that is composed of the metal having a higher affinity for oxygen than copper and copper oxide and a lower region that is composed of a non-stoichiometric oxide of said metal. The interconnect structure further includes a dielectric cap located on at least an upper surface of the composite M-MOx cap.

19 Claims, 3 Drawing Sheets

SELF-ALIGNED COMPOSITE M-MOX/DIELECTRIC CAP FOR CU INTERCONNECT STRUCTURES

BACKGROUND

The present invention relates to an interconnect structure and methods of fabricating the same. More particularly, the present invention relates to an interconnect structure having enhanced electromigration reliability in which a composite metal (M)-metal oxide (MOx)/dielectric cap is employed.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines are achieved in today's IC product chips by embedding the metal lines and metal vias (e.g., conductive features) in a dielectric material having a dielectric constant of less than 4.0.

In semiconductor interconnect structures, electromigration (EM) has been identified as one metal failure mechanism. Electromigration is the transport of material caused by the gradual movement of the ions in a conductor due to the momentum transfer between conducting electrons and diffusing metal atoms. The effect is important in applications where high direct current densities are used, such as in microelectronics and related structures. As the structure size decreases, the practical significance of EM increases.

EM is one of the worst reliability concerns for very large scale integrated (VLSI) circuits and manufacturing since the 1960's. The problem not only needs to be overcome during the process development period in order to qualify the process, but it also persists through the lifetime of the chip. Voids are created inside the metal conductors of an interconnect structure due to metal ion movement caused by the high density of current flow.

Although the fast diffusion path in metal interconnects varies depending on the overall integration scheme and materials used for chip fabrication, it has been observed that metal atoms, such as Cu atoms, transported along the metal/post planarized dielectric cap interface play an important role on the EM lifetime projection. The EM initial voids first nucleate at the metal/dielectric cap interface and then grow in the direction to the bottom of the interconnect, which eventually results in a circuit dead opening.

It has been demonstrated that by replacing the Cu/dielectric interface with a Cu/metal interface can enhance electromigration resistance by greater than 100x. Prior art metal caps are typically comprised of a Co-containing alloy such as, for example, CoWP, which is selectively deposited atop of the Cu conductor region of the interconnect structure by a plating process. Although metal caps can improve the electromigration resistance of the interconnect structure, prior art metal cap plating processes have some drawbacks associated therewith. For example, it is difficult to reduce the thickness of a Co-containing alloy to a sub-5 nm range by conventional wet plating processes. Thus, the thicker Co-containing alloy caps will have a significant resistance impact to Cu lines as the Cu line is reduced to sub-50 nm. Moreover, conventional wet plating processes that are typically used in forming Co-containing alloy caps may have a detrimental impact by absorption to high porosity (greater than 25% porosity) ultra low k porous SiCOH dielectric films that are being presently implemented in sub-32 nm interconnect structures. Furthermore, the selective plating of Co-containing alloy caps is not perfectly selective and some of the cap material may extend onto the dielectric surface creating shorts in the interconnect structure.

It is also worth mentioning that during a clean in dilute hydrofluoric acid, which is generally used to clean the surface of the interconnect dielectric material, corrosion of metal caps may occur. This is particularly observed when CoWP is used as the metal cap material.

Moreover, the current high rf power reducing plasmas that are also used to clean the Cu surface prior to dielectric deposition or Co-containing alloy plating will cause substantial damage to the underlying low k dielectric material surface and degrade both the electrical and mechanical properties.

SUMMARY OF THE INVENTION

In one embodiment of the invention, a self-aligned composite metal (M)-metal oxide (MOx) cap is employed within a Cu-containing interconnect structure. The presence of the self-aligned composite M-MOx cap improves the electromigration of a Cu-containing interconnect structure while reducing the metal cap thickness to a sub-5 nm range to minimize the resistance increase to the Cu-containing interconnect structure. In addition, the metal film that is deposited on the Cu surface will react with any oxygen residue present within the Cu feature to form a stable MOx region at the Cu interface that will remain in the structure even after a thermal or low rf power reducing plasma cleaning process. A dielectric cap is subsequently formed to protect the surface of the M region of the M-MOx cap from oxidizing in air and to provide an etch/CMP stop surface during subsequent processes.

In one aspect of the invention, an interconnect structure is provided that includes an interconnect dielectric material having a dielectric constant of about 4.0 or less. The interconnect dielectric material has at least one opening therein that is filled with a Cu-containing material. The Cu-containing material within the at least one opening has an exposed upper surface that is co-planar with an upper surface of the interconnect dielectric material. The interconnect structure further includes a composite M-MOx cap located at least on the upper surface of the Cu-containing material that is located within the at least one opening. The composite M-MOx cap includes an upper region that is composed of a metal having a higher affinity for oxygen than copper and copper oxide and a lower region at an interface with the Cu-containing material that is composed of a non-stoichiometric oxide of said metal. The interconnect structure further includes a dielectric cap located on at least an upper surface of the composite M-MOx cap.

In another aspect of the invention, methods of providing the above mentioned interconnect structure are disclosed. In one embodiment of the invention, the method includes providing an interconnect dielectric material having a dielectric constant of about 4.0 or less. The interconnect dielectric material that is provided has at least one opening that is filled with a Cu-containing material. The Cu-containing material has an exposed upper surface that is co-planar with an upper surface of the interconnect dielectric material. A metal layer is formed on at least the exposed upper surface of the Cu-containing material. The metal layer is composed of a metal having a higher affinity for oxygen than copper and copper oxide. Annealing is then performed to react any oxygen within the Cu-containing material with the metal layer forming a composite M-MOx cap. The composite M-MOx cap that is formed after annealing includes an upper region that is composed of the metal having a higher affinity for oxygen than copper and copper oxide and a lower region that is composed of a non-stoichiometric oxide of the metal. A dielectric capping material is formed on at least an upper surface of the composite M-MOx cap.

In another embodiment of the invention, a method is provided that includes providing an interconnect dielectric material having a dielectric constant of about 4.0 or less. The interconnect dielectric material has at least one opening that is filled with a Cu-containing material. The Cu-containing material has an exposed upper surface that is co-planar with an upper surface of the interconnect dielectric material. A metal layer is formed on at least the exposed upper surface of the Cu-containing material. The metal layer that is formed is composed of a metal having a higher affinity for oxygen than copper and copper oxide. A dielectric capping material is then formed on at least an upper surface of the metal layer. Next, annealing is performed to react any oxygen within the Cu-containing material with the metal layer forming a composite M-MOx cap between the Cu-containing material and the dielectric capping material. The composite M-MOx cap that is formed after annealing includes an upper region that is composed of the metal having a higher affinity for oxygen than copper and copper oxide and a lower region that is composed of a non-stoichiometric oxide of the metal.

DETAILED DESCRIPTION

The present invention, which provides an interconnect structure having enhanced electromigration (EM) reliability and methods of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
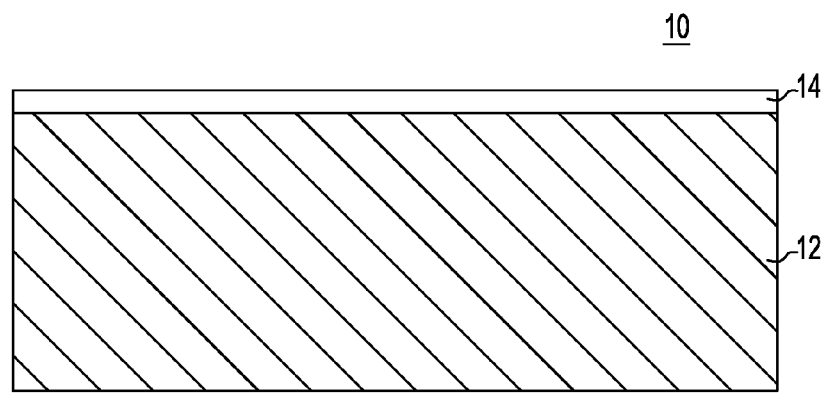
FIG. 1 is a pictorial representation (through a cross sectional view) illustrating an initial structure that can be employed in one embodiment of the invention including a hard mask located on an upper surface of an interconnect dielectric material.
Figure 2:
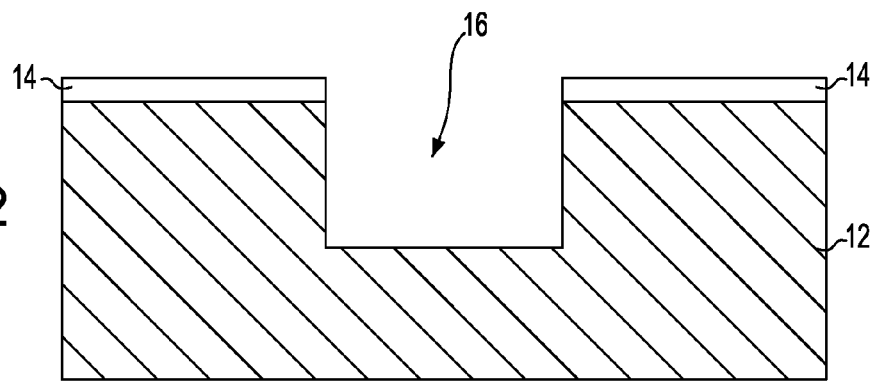
FIG. 2 is a pictorial representation (through a cross sectional view) illustrating the structure of FIG. 1 after forming at least one opening within the hard mask and the interconnect dielectric material.

Reference is first made to FIGS. 1-6 which are pictorial representations (through cross sectional views) illustrating an exemplary interconnect structure of the present invention through various processing steps in accordance with one embodiment of the invention. Specifically, FIG. 1 illustrates an initial structure 10 that can be employed in the present invention in fabricating the inventive interconnect structure. The initial structure 10 includes an interconnect dielectric material 12 having a hard mask 14 located on an upper surface thereof.

The initial structure 10 illustrated in FIG. 1 is typically located upon a substrate (not shown in the drawings of the present application). The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the semiconductor substrate 12 can also be a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent a first interconnect level of a multilayered interconnect structure.

The interconnect dielectric material 12 of the initial structure 10 includes any interlevel or intralevel dielectric including inorganic dielectrics or organic dielectrics. The interconnect dielectric material 12 may be porous, non-porous or contain regions and/or surfaces that are porous and other regions and/or surfaces that may be non-porous. Some examples of suitable dielectrics that can be used as the interconnect dielectric material 12 include, but are not limited to silicon oxide, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The low k interconnect dielectric 12 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the interconnect dielectric material 12 may vary depending upon the dielectric material used as well as the exact number of dielectric layers within the interconnect dielectric material 12. Typically, and for normal interconnect structures, the interconnect dielectric material 12 has a thickness from 50 nm to 1000 nm.

The interconnect dielectric material 12 can be formed utilizing any conventional deposition process including, but not limited to chemical vapor deposition (CVD), plasma enhanced chemical vapor deposition (PECVD), atomic layer deposition (ALD), plasma enhanced atomic layer deposition (PE-ALD), evaporation, chemical solution deposition and spin-on coating.

After forming the interconnect dielectric material 12, hard mask 14 is typically formed on an exposed upper surface of interconnect dielectric material 12. The hard mask 14 can be composed of an oxide, nitride, oxynitride or multilayers thereof (e.g., a hard mask comprising an oxide and a nitride). The hard mask 14 typically comprises a semiconductor oxide, semiconductor nitride and/or a semiconductor oxynitride. Preferably, the hard mask 14 comprises an oxide of silicon and/or a nitride of silicon.

In some embodiments, the hard mask 14 may be formed utilizing any conventional deposition process including, for example, CVD, PECVD, evaporation, chemical solution deposition, physical vapor deposition (PVD) and atomic layer deposition (ALD and PE-ALD). In other embodiments, the hard mask 14 can be formed by a thermal process such as, for example, a thermal oxidation, a thermal nitridation and/or a thermal oxynitridation process. In yet other embodiments, the hard mask 14 can be formed utilizing a combination of deposition and thermal processes.

The thickness of the hard mask 14 may vary depending on the number of materials within the hard mask itself as well as the technique that was used in forming the same. Typically, the hard mask 14 has a thickness from 10 nm to 80 nm.

After forming the initial structure 10 shown in FIG. 1, at least one opening 16 is formed into the interconnect dielectric material 12 utilizing the hard mask 14 as a pattern mask. The resultant structure including the at least one opening 16 within the interconnect dielectric material 12 and the hard mask 14 is shown, for example, in FIG. 2. The at least one opening 16 may include a via opening, a line opening, a combined via and line opening, or any combinations thereof. In the drawings, a single line opening is shown by way of a non-limiting example.

The at least one opening 16 can be formed utilizing conventional lithography and etching. The lithographic step includes forming a photoresist (organic, inorganic or hybrid) atop the hard mask 14 utilizing a conventional deposition process such as, for example, CVD, PECVD, ALD, PE-ALD and spin-on coating. Following formation of the photoresist, the photoresist is exposed to a desired pattern of radiation. The exposed photoresist is developed utilizing a conventional resist development process. After the development step, an etching step is performed to transfer the pattern from the patterned photoresist into the hard mask 14 and then the interconnect dielectric material 12. The patterned photoresist is typically removed from the surface of the structure after transferring the pattern into the hard mask 14 utilizing a conventional resist stripping process such as, for example, ashing. The etching step used in forming the at least one opening 16 can include a dry etching process (including reactive ion etching, ion beam etching, plasma etching or laser ablation), a wet chemical etching process or any combination thereof. Typically, reactive ion etching is used to form the at least one opening 16.

Figure 3:
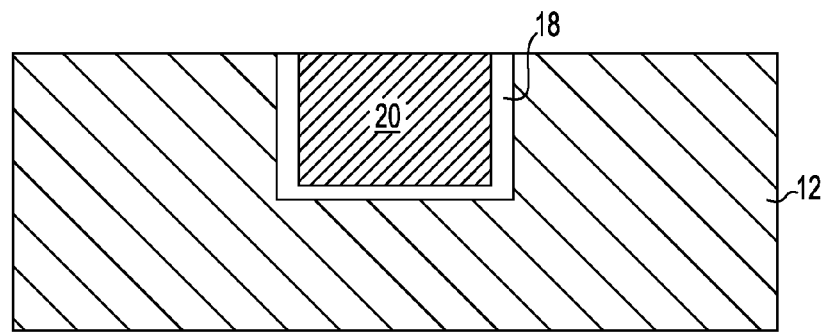
FIG. 3 is a pictorial representation (through a cross sectional view) illustrating the structure of FIG. 2 after filling the at least one opening with a Cu-containing material and planarization.

Referring to FIG. 3, a diffusion barrier 18 and a Cu-containing material 20 are formed into each of the at least one openings 16. The diffusion barrier 18 includes Ta, TaN, Ti, TiN, Ru, RuN, RuTa, RuTaN, IrTa, IrTaN, W, WN or any other material that can serve as a barrier to prevent conductive material from diffusing there through. The thickness of the diffusion barrier 18 may vary depending on the deposition process used as well as the material employed. Typically, the diffusion barrier 18 has a thickness from 4 nm to 40 nm, with a thickness from 7 nm to 20 nm being more typical. The diffusion barrier 18, which is located between the Cu-containing material 20 and the interconnect dielectric material 12 can be formed by any conventional deposition process including, for example, CVD, PECVD, ALD, PE-ALD, PVD, sputtering and plating. In some embodiment, the diffusion barrier is not present within the at least one opening. In yet other embodiments, the diffusion barrier is present only on the sidewalls of the at least one opening. In yet another embodiment, the diffusion barrier is present on all wall portions within the at least one opening.

The Cu-containing material 20 used in forming the conductive region of the interconnect structure includes, for example, elemental Cu or a Cu alloy such as AlCu. The Cu-containing material 20 can be formed into each of the openings 16 that are optionally lined with the diffusion barrier 18 utilizing any conventional deposition process including, for example, CVD, PECVD, PVD, sputtering, plating, chemical solution deposition and electroless plating. After deposition of the Cu-containing material 20, the structure is subjected to a planarization process such as, for example, chemical mechanical polishing (CMP) and/or grinding. In some embodiments, the planarization process provides a planar structure such as is shown in FIG. 3 in which the upper surfaces of the interconnect dielectric material 12, the diffusion barrier 18 (which is now U-shaped) and the Cu-containing material 20 are substantially coplanar with each other. It is noted that during the planarization process, the remaining hard mask 14 is removed from the structure. It is further noted that during the formation of Cu-containing material 20 or during planarization or after planarization oxygen is typically introduced in the Cu-containing material 20. The presence of oxygen within the Cu-containing material decreases the interconnect reliability and increases the resistance of the interconnect structure.

Figure 4:
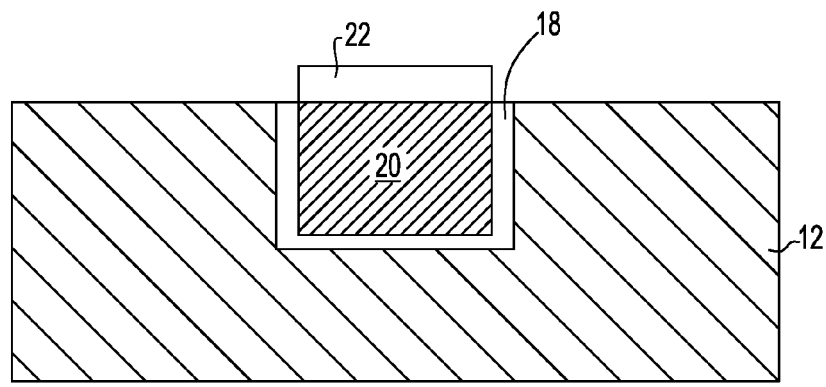
FIG. 4 is a pictorial representation (through a cross sectional view) illustrating the structure of FIG. 3 after selectively forming a metal layer that has a high affinity for oxygen on at least the upper surface of the Cu-containing material.

Referring now to FIG. 4, there shown the structure of FIG. 3 after forming a metal layer 22 that has a higher affinity for oxygen than copper and copper oxide on the upper surface of at least the Cu-containing material 20. In some embodiments of the present invention in which a selective deposition process is used to form metal layer 22, the metal layer 22 is located only atop the Cu-containing material 20. That is, the metal layer 22 that is formed by selective deposition does not extend on the upper surface of interconnect dielectric material 12; some portion of the metal layer 22 may extend onto the upper surface of the diffusion barrier 18. In yet another embodiment of the present invention in which a non-selective deposition process is employed, the metal layer 22 is located on the upper surface of the Cu-containing material 20 and extends on the upper surface of the interconnect dielectric material 12. FIG. 4 illustrates the embodiment in which a selective deposition process is employed.

By "high affinity for oxygen" it is meant that the metal layer 22 includes a metal that has a higher metal oxide formation energy as compared to copper and copper oxide. Such a metal layer can be determined from an Ellingham Oxidation Energy Diagram in a $CO/O_2$ oxidizing ambient. Illustrative examples of metals that have a high affinity for oxygen and that can be used as metal layer 22 include Mn, Ta, Nb, Ti, Zr, Al, Ru, Co, Zn, Fe and Sn. In one embodiment of the invention, the metal layer 22 is composed of Mn.

The thickness of the metal layer 22 may vary depending on the type of metal present in the metal layer 22, as well as the deposition technique and conditions employed. Typically, the metal layer 22 has a thickness from 0.3 nm to 10 nm, with a thickness from 0.5 nm to 3 nm being more typical.

As mentioned above, the metal layer 22 can be formed by a selective deposition process or a non-selective deposition process. Examples of selective deposition processes that can be employed in the present invention in forming metal layer 22 include, but are not limited to CVD, PECVD, ALD and PE-ALD. In one embodiment, a low temperature (of less than 300° C., preferably less than 150° C.) selective deposition process is used in forming the metal layer 22. In another embodiment, Mn can be selectively deposited on a Cu surface using bis(N,N'-diisopropylpentylamidinato) manganese (II) with hydrogen and nitrogen at 300° C. at about 3-5 Torrs using a CVD process.

Examples of non-selective deposition processes that can be used in forming the metal layer 22 include, but are not limited to plating, sputtering, and chemical solution deposition.

Figure 5:
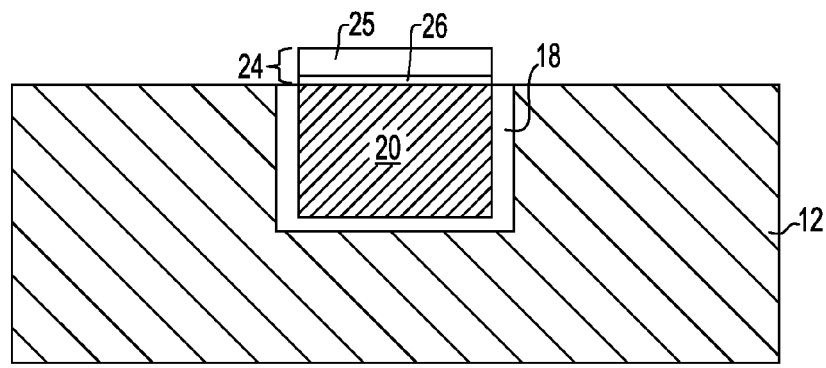
FIG. 5 is a pictorial representation (through a cross sectional view) illustrating the structure of FIG. 4 after annealing to form a self-aligned composite M-MOx cap on the upper surface of the Cu-containing material.

Referring now to FIG. 5, there is illustrated the structure of FIG. 4 after performing an thermal anneal in accordance with one embodiment of the invention. It is noted that UV curing (see conditions below) and/or a low rf power plasma treatment (see conditions below) may be used instead of thermal annealing or in conjunction with thermal annealing. Notwithstanding the type of anneal process employed, the anneal reacts with any oxygen within the Cu-containing material 20 forming a self-aligned composite M-MOx cap 24 from metal layer 22. The composite M-MOx cap 24 includes an upper region 25 of metal having the higher affinity for oxygen as compared to copper and copper oxide and a lower region 26 that is composed of a non-stoichiometric oxide of the metal. In the nomenclature "M-MOx" the "M" refers to the upper region 25, while the "MOx" refers to the lower region 26. The lower region 26 of composite M-MOx cap 24 is located on an upper surface of the Cu-containing material 20 and thus a bottom surface of the lower region 26 forms an interface with the upper surface of the Cu-containing material 20. Generally, the content of oxygen within the lower region 26 is greater than the content of oxygen within the upper region 25. Also, the oxygen content within the lower region 26 diminishes from the lower region/Cu-containing material interface to the upper region 25. It should be noted that under long thermal annealing conditions (300-400° C., greater than 10 min in a $N_2/H_2$ ambient), the upper region 25 metal having a small atomic size such as, for example, Mn and Al, may diffuse through the MOx layer into Cu-containing material leaving very little metal left in region 25. In this case, a small increase in metal concentration at the lower region MOx-Cu-containing material interface may be observed. Furthermore, if the original metal layer 22 is thin, most of the metal may be consumed during annealing to form MOx lower region 26 leaving a very thin upper region 25.

It is also noted that after the anneal the content of oxygen within the Cu-containing material 20 is less than the content of oxygen within the Cu-containing material 20 before annealing. The reason for this is that during the anneal the oxygen migrates from the Cu-containing material into the interface and reacts with the metal in layer 22 forming the lower region 26 of the composite M-MOx cap 24. The removal of oxygen from the Cu-containing material 20 improves the interconnect reliability as well as the copper resistance. It is further noted that the lower region 26 provides good adhesion to the Cu-containing material.

The thermal anneal that is used in forming the self-aligned composite M-MOx cap 24 is performed in a non-oxidizing ambient. By "non-oxidizing ambient" it is meant an ambient that does not include a substantial concentration (e.g., less than 10 ppm (part per million)) of oxygen. Examples of suitable non-oxidizing ambients that can be employed during the thermal anneal include, but are not limited to, inert ambients including He, Ar, Ne, Xe, $N_2$ and mixtures thereof, a forming gas (i.e., a mixture of $N_2/H_2$), and hydrocarbon gases (e.g., $C_2H_4$, $CH_4$, and $C_3H_8$). In one embodiment, He and/or Ar is used as the non-oxidizing ambient. In another ambient, a forming gas anneal is employed. The thermal anneal may include a furnace anneal, a rapid thermal anneal, a laser anneal, a microwave anneal or any combination thereof. The thermal anneal is typically performed at a temperature from 150° C. to 450° C., with a temperature from 250° C. to about 350° C. being more typical. Other annealing temperatures can also be employed so long as they are capable of causing a reaction between the metal layer 22 and the oxygen within the Cu-containing material 20.

In the embodiment illustrated in FIG. 5, the composite M-MOx cap 24 does not extend onto the upper surface of the interconnect dielectric material 12. In other embodiments of the invention, in which a non-selective deposition process was used in forming the metal layer 22, a portion of the composite M-MOx cap 24 extends onto an upper surface of the interconnect dielectric material 12. In such an embodiment, the portion of the composite M-MOx cap that extends onto the interconnect dielectric material 12 is composed of said metal having the higher affinity for oxygen as compared to copper oxide. In either case, at least the lower region 26 of the composite M-MOx cap 24 is self-aligned to the Cu-containing material 20. It is noted that during the subsequent formation of the dielectric cap, the metal portion that extends onto the dielectric material can be converted to a modified metal dielectric layer that includes some elements of the underlying interconnect dielectric material during thermal annealing to form a dielectric layer. For example, when the metal is Mn and the dielectric layer is SiCOH then a metal dielectric $MnSi_xC_yOH$ will form during thermal annealing (300-400° C., inert gas ambient).

Other additional annealing processes such as UV curing (typical conditions are 300° C. in inert gases Ar/He, $H_2/N_2$ ambient for greater than 1 min), or low rf power plasma treatments (less than 0.1 w/cm² rf power density, 3-5 Torr, 13.6 MHz, in inert gases Ar/He or $N_2/H_2$, greater than 1 min) can be utilized besides or in conjunction with thermal anneal. In one embodiment, UV curing or a low rf power plasma treatment can be used to enhance the metal-dielectric formation to form a stable dielectric material.

Figure 6:
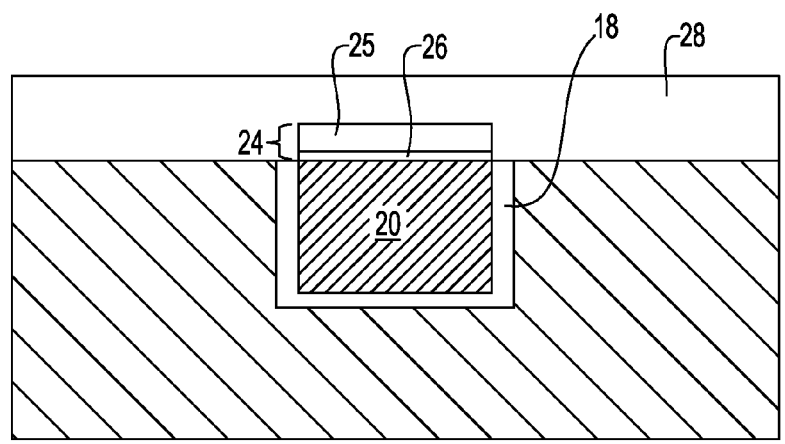
FIG. 6 is a pictorial representation (through a cross sectional view) illustrating the structure of FIG. 5 after forming a dielectric cap atop the structure.

Referring now to FIG. 6, there is illustrated the structure of FIG. 5 after forming a dielectric cap 28 across the entire structure including on at least an upper surface of the self-aligned M-MOx cap 24. In some embodiments, the dielectric cap 28 is composed of a single dielectric cap layer. In other embodiments, the dielectric cap 28 is composed of multiple dielectric cap layers. The dielectric cap 28 comprises any non-oxygen containing dielectric capping material such as, for example, SiC, $Si_3N_4$, a carbon doped oxide, a nitrogen and hydrogen doped silicon carbide SiC(N,H), boron nitride, SiCBN, carbon boron nitride or multilayers thereof.

The thickness of the dielectric cap 28 may vary depending on the technique used to form the same as well as the material make-up of the layer. Typically, the dielectric cap 28 has a thickness from 5 nm to 100 nm, with a thickness from 15 nm to 45 nm being more typical. The dielectric cap 28 can be formed utilizing any conventional deposition process including, for example, CVD, PECVD, ALD, PE-ALD, evaporation, spin-on coating, chemical solution deposition and PVD.

Figure 7:
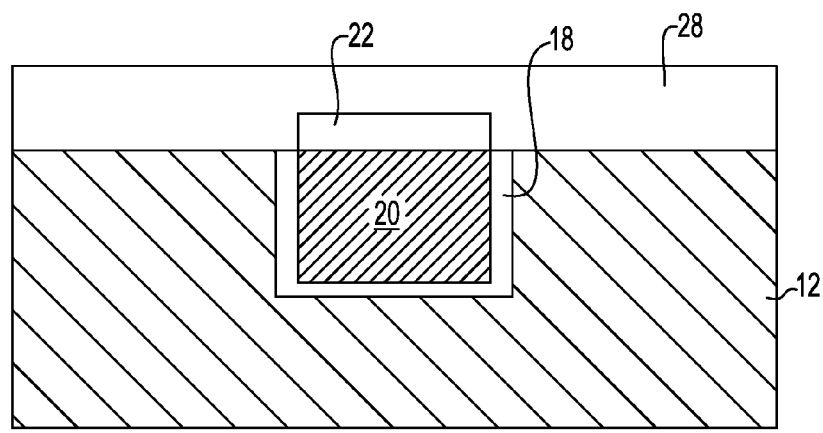
FIG. 7 is a pictorial representation (through a cross sectional view) illustrating an alternative embodiment of the present invention in which a dielectric cap is formed on the structure shown in FIG. 4.
Figure 8:
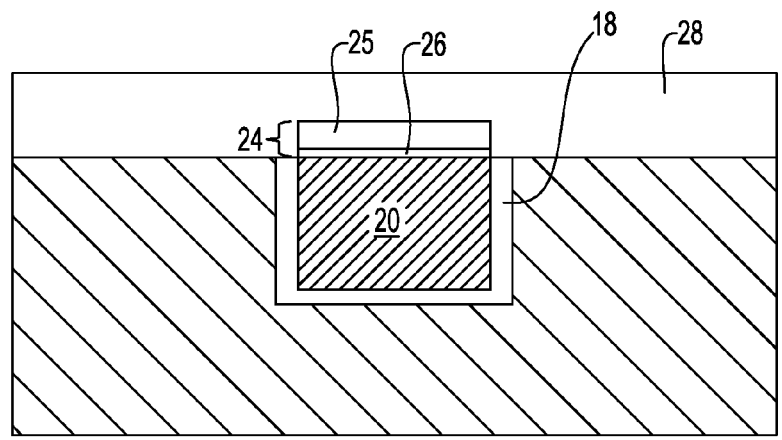
FIG. 8 is a pictorial representation (through a cross sectional view) illustrating the structure of FIG. 7 after annealing to form a self-aligned composite M-MOx/dielectric cap on the upper surface of the Cu-containing material.

Reference is now made to FIGS. 7-8 which illustrate another embodiment of the present invention. This embodiment of the present invention begins by first providing the structure shown in FIG. 4. However, unlike the embodiment described above in FIGS. 5-6, this embodiment, forms the dielectric cap 28 prior to thermal annealing. FIG. 7 shows the structure of FIG. 4 after forming the dielectric cap 28 on the structure, while FIG. 8 illustrates the structure after performing a thermal annealing, The materials and processes for forming the dielectric cap 28 and conditions for performing the thermal anneal are the same as described above.

The interconnect structures that are shown in FIGS. 6 and 8 are the same and each structure includes an interconnect dielectric material 12 having a dielectric constant of about 4.0 or less. The interconnect dielectric material 12 has at least one opening 16 therein that is filled with a Cu-containing material 20. The Cu-containing material 20 within the at least one opening 16 has an exposed upper surface that is co-planar with an upper surface of the interconnect dielectric material 12. The interconnect structure further include a composite M/MOx cap 24 located at least on the upper surface of the Cu-containing material 20 within the at least one opening 16. The M-MOx cap 24 includes an upper region 25 that is composed of a metal having a higher affinity for oxygen than copper and copper oxide and a lower region 26 that is composed of a non-stoichiometric oxide of said metal. A dielectric cap 28 is located on at least an upper surface of the composite M-MOx cap 24.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
    an interconnect dielectric material having a dielectric constant of about 4.0 or less, said interconnect dielectric material having at least one opening therein that is filled with a Cu-containing material, said Cu-containing material within the at least one opening having an upper surface that is co-planar with an upper surface of the interconnect dielectric material;
    a composite M-MOx cap located at least atop said Cu-containing material within the at least one opening, wherein said composite M-MOx cap includes an upper region M that is composed of a metal having a higher affinity for oxygen than copper and copper oxide and a lower region MOx that is composed of a non-stoichiometric oxide of said metal, wherein a bottommost surface of said lower region of said composite M-MOx cap is located directly on said upper surface of said Cu-containing material and wherein said lower region of said composite M-MOx cap has edges that are vertically coincident with edges of said Cu-containing material; and
    at least one dielectric cap layer located on at least an upper surface of the composite M-MOx cap.

2. The interconnect structure of wherein claim 1 wherein said metal M of said composite M-MOx cap is selected from Mn, Ta, Nb, Ti, Zr, Al, Ru, Co, Zn, Fe and Sn.

3. The interconnect structure of claim 2 wherein said metal of said composite M-MOx cap is Mn.

4. The interconnect structure of claim 1 wherein said lower region of said composite M-MOx cap has a higher oxygen content than the upper region of said composite M-MOx cap.

5. The interconnect structure of claim 4 wherein said content of oxygen within the lower region diminishes from an interface with the Cu-containing material upwards to the upper region of the composite M-MOx cap.

6. The interconnect structure of claim 1 wherein said dielectric cap is a non-oxygen containing dielectric capping material.

7. The interconnect structure of claim 6 wherein said non-oxygen containing dielectric capping material is selected from SiC, $Si_3N_4$, a carbon doped oxide, a nitrogen and hydrogen doped silicon carbide SiC(N,H), boron nitride, SiCBN, carbon boron nitride and multilayers thereof.

8. The interconnect structure of claim 1 wherein said Cu-containing material within said at least one opening includes elemental Cu or a Cu alloy.

9. The interconnect structure of claim 1 further comprising a diffusion barrier located between said interconnect dielectric material and said Cu-containing material.

10. The interconnect structure of claim 1 wherein said upper region of said composite M-MOx cap has edges that are vertically coincident with said edges of said lower region of said composite M-MOx cap.

11. The interconnect structure of claim 1 wherein a portion of said upper region of said composite M-MOx extends onto an upper surface of the interconnect dielectric material, wherein said portion of said upper region of said composite M-MOx cap that extends onto the upper surface of the interconnect dielectric material includes at least one element of said interconnect dielectric material.

12. An interconnect structure comprising:
    an interconnect dielectric material having a dielectric constant of about 4.0 or less, said interconnect dielectric material having at least one opening therein that is filled with a Cu-containing material, said Cu-containing material within the at least one opening having an upper surface that is co-planar with an upper surface of the interconnect dielectric material;

a composite M-MOx cap located at least atop said Cu-containing material within the at least one opening, wherein said composite M-MOx cap includes an upper region M that is composed of a metal having a higher affinity for oxygen than copper and copper oxide and a lower region MOx that is composed of a non-stoichiometric oxide of said metal, wherein a bottommost surface of said lower region of said composite M-MOx cap is located directly on said upper surface of said Cu-containing material and wherein said lower region of said composite M-MOx cap has edges that are vertically coincident with edges of said Cu-containing material and wherein said upper region of said composite M-MOx cap has edges that are vertically coincident with said edges of said lower region of said composite M-MOx cap; and at least one dielectric cap layer located on at least an upper surface of the composite M-MOx cap, wherein a portion of said at least one dielectric cap layer directly contacts said upper surface of said interconnect dielectric material.

13. The interconnect structure of wherein claim 12 wherein said metal M of said composite M-MOx cap is selected from Mn, Ta, Nb, Ti, Zr, Al, Ru, Co, Zn, Fe and Sn.

14. The interconnect structure of claim 13 wherein said metal of said composite M-MOx cap is Mn.

15. The interconnect structure of claim 12 wherein said lower region of said composite M-MOx cap has a higher oxygen content than the upper region of said composite M-MOx cap.

16. The interconnect structure of claim 15 wherein said content of oxygen within the lower region diminishes from an interface with the Cu-containing material upwards to the upper region of the composite M-MOx cap.

17. An interconnect structure comprising:

an interconnect dielectric material having a dielectric constant of about 4.0 or less, said interconnect dielectric material having at least one opening therein that is filled with a Cu-containing material, said Cu-containing material within the at least one opening having an upper surface that is co-planar with an upper surface of the interconnect dielectric material;

a composite M-MOx cap located at least atop upper surface of said Cu-containing material within the at least one opening, wherein said composite M-MOx cap includes an upper region M that is composed of a metal having a higher affinity for oxygen than copper and copper oxide and a lower region MOx that is composed of a non-stoichiometric oxide of said metal; and at least one dielectric cap layer located on at least an upper surface of the composite M-MOx cap, wherein said metal M of said composite M-MOx cap is selected from Mn, Ta, Nb, Ti, Zr, Al, Ru, Co, Zn, Fe and Sn.

18. The interconnect structure of claim 17 wherein a bottommost surface of said lower region of said composite M-MOx cap is located directly on said upper surface of said Cu-containing material and wherein said lower region of said composite M-MOx cap has edges that are vertically coincident with edges of said Cu-containing material.

19. The interconnect structure of claim 18 wherein said upper region of said composite M-MOx cap has edges that are vertically coincident with said edges of said lower region of said composite M-MOx cap.

* * * * *